United States Patent

Hibbs, Jr.

[15] 3,703,001

[45] Nov. 14, 1972

[54] ANALOG TO DIGITAL CONVERTER

[72] Inventor: Eugene B. Hibbs, Jr., 135 N. Verdugo Road, Glendale, Calif. 91206

[22] Filed: May 22, 1969

[21] Appl. No.: 826,897

[52] U.S. Cl......340/347 NT, 340/347 AD, 324/99 D, 235/183

[51] Int. Cl...........................................H03k 13/20

[58] Field of Search......340/347; 324/111, 120, 130, 324/99; 235/183

[56] References Cited

UNITED STATES PATENTS

| | | | |
|---|---|---|---|
| 3,177,482 | 4/1965 | Chase | 324/130 X |
| 3,493,964 | 2/1970 | Hunger | 340/347 |
| 2,897,486 | 7/1959 | Alexander et al. | 340/347 |
| 2,994,825 | 8/1961 | Anderson | 340/347 X |
| 3,316,547 | 4/1967 | Ammann | 340/347 |
| 3,336,478 | 8/1967 | Franklin | 235/183 X |
| 3,349,390 | 10/1967 | Glassman | 340/347 |
| 3,412,331 | 11/1968 | Boatwright et al. | 324/120 |
| 3,475,748 | 10/1969 | Price et al. | 340/347 |
| 3,480,948 | 11/1969 | Lord | 340/347 |
| 3,483,364 | 12/1969 | Leeson, Jr. | 235/183 X |

*Primary Examiner*—Thomas A. Robinson
*Assistant Examiner*—Charles D. Miller
*Attorney*—Fulwider, Patton, Rieber, Lee & Utecht

[57] ABSTRACT

An analog to digital converter of the dual slope integrating type in which the integrating capacitor of an integrator is in a full wave bridge circuit during a first integration period so that the unknown input voltage applied directly to the integrator may be either positive, negative or alternating without affecting the direction of charge of the capacitor. During a discharge period, the capacitor is connected for discharge when a reference voltage is applied to the input of the integrator. Before each measurement, the operational amplifier of the integrator is automatically rebalanced. High and low clock frequencies with a 10 to 1 ratio are provided and are selectively applied to the counter during the charge and discharge periods to provide different ranges for the converter, range being automatically changed as necessary.

11 Claims, 10 Drawing Figures

INVENTOR.
EUGENE B. HIBBS JR.
BY Zulwider, Patton, Rieber Lee, and Utecht
ATTORNEYS INVENTOR.
EUGENE B. HIBBS JR.
BY Fulwider, Patton, Rieber Lee, and Utecht
ATTORNEYS INVENTOR.
EUGENE B. HIBBS JR.
BY Zulwider, Patton, Rieber Lee, and Utecht
ATTORNEYS

ANALOG TO DIGITAL CONVERTER

BACKGROUND OF THE INVENTION

This invention relates generally to apparatus for analog to digital conversion and, more particularly, to converters of the dual slope integrating type in which an unknown input voltage is integrated for a predetermined time period to charge an integrating capacitor and then a reference voltage is integrated to discharge the integrating capacitor until a zero-voltage level across the integrating capacitor is reached with the duration of the second integration period being proportional to the unknown voltage.

Analog to digital converters in general, and, more specifically, digital voltmeters of the dual slope integrating type ordinarily employ integrating circuits having an operational amplifier and an integrating capacitor. Because of the normally high gains of such operational amplifiers they are prone to drift out of balance in time, necessitating rebalancing. In order to minimize this effect, the operational amplifiers of many digital voltmeters contain numerous compensating circuits to enhance stability. Still, however, without periodically monitoring the balance of such operational amplifiers, it is difficult or impossible to determine if the amplifier is balanced or not.

In order to provide as versatile an instrument as possible, most digital voltmeters are designed to accept either positive or negative voltages, with the polarity of the input voltage being internally determined and the circuitry adjusted accordingly. In many cases, the input voltage is applied to an auxilliary circuit to produce an absolute value of a particular polarity before the input is applied to the integrator. The absolute value circuit must be carefully designed in order to ensure that the magnitude of the output voltage is the same as the unknown input voltage. Ordinarily, A.C. input voltages are first connected to a rectifying circuit, either manually or automatically, before application to the integrator.

Since, as a practical matter, the operating voltage range of operational amplifiers is limited, in order to utilize the voltmeter for a wide range of unknown input voltages, some means for changing the range of the voltmeter is ordinarily provided. Customarily, the range changing arrangement is a step attenuator between the input terminal and the integrator which is either manually or automatically controlled. Such attenuators ordinarily require relatively expensive precision resistors if the voltmeter is to be accurate.

SUMMARY OF THE INVENTION

The present invention provides an analog to digital converter in the form of a digital voltmeter, or the like, of the dual slope integrating type in which the integrator is rebalanced before each measurement. This technique takes advantage of the fact that the factors which ordinarily cause the operational amplifiers of such integrators to drift are relatively slowly changing and that, once balanced, an operational amplifier can be relied on to remain substantially balanced for the relatively short period required for a single measurement.

By way of example, the operational amplifier of a presently preferred embodiment of a digital voltmeter constructed according to the present invention may be designed for relatively short term stability without a loss of accuracy. Utilization of an automatic and continuous rebalancing technique, in accordance with the present invention, eliminates the need for manual balancing and eliminates errors due to drifting of operational amplifier parameters.

Furthermore, the possibility of error in the digital voltmeter is reduced by simplifying the input circuitry to the integrator. The integrator of the voltmeter includes an integrating capacitor which is connected in a full wave bridge means during the charging portion of a measuring cycle so that the integrating capacitor is always charged in only a single direction regardless of the polarity of the input. During the discharge portion of the measuring cycle, when the integrator input is connected to the reference voltage, the bridge is modified so that the integrating capacitor is discharged. Hence, positive, negative, or alternating unknown input voltages may be connected directly to the integrator, thereby eliminating auxilliary circuits between the input voltage and the input to the integrator. Thus, the accuracy of the digital voltmeter is improved and the complexity of the input circuitry of the voltmeter is decreased.

Range changes for the digital voltmeter of the present invention are accomplished by providing both high and low clock frequencies which, in the preferred embodiment described, have a ratio of 10:1. The high and low clock frequencies are selectively applied to the counter of the voltmeter during the charge and discharge periods, with the ratio of clock frequency during the charge and discharge periods determining the effective range of the voltmeter. Thus, the range of the voltmeter is determined by a digital technique rather than the analog technique of the step attenuators formerly employed. The accuracy of the voltmeter is thereby increased while eliminating the relatively expensive precision resistors of the attenuators.

Thus, the analog to digital conversion system of the present invention is capable of great accuracy over a wide range of input levels without using relatively expensive precision components, a highly stabilized operational amplifier or complex circuitry between the input terminal and the integrator.

DESCRIPTION OF THE PREFERRED EMBODIMENT

Figure 1:
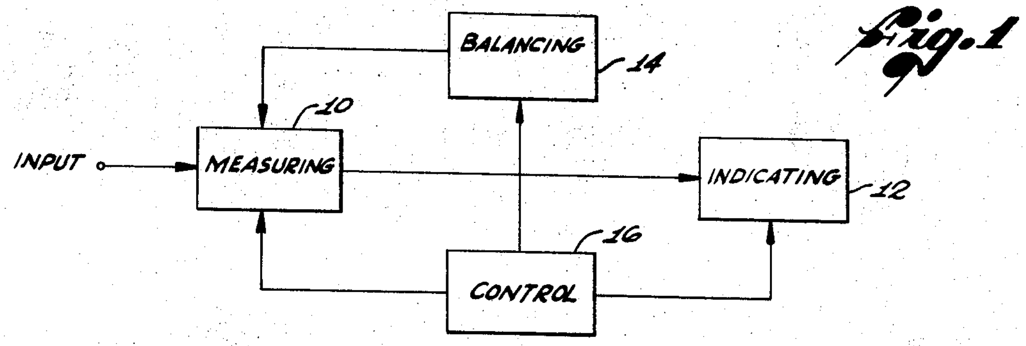
FIG. 1 is a block diagram illustrating the cooperation between the primary system units of a digital voltmeter constructed in accordance with the present invention.

Referring now to the drawings, and particularly to FIG. 1 thereof, there is shown a presently preferred embodiment of an analog to digital converter in accordance with the present invention. The preferred embodiment of the converter is in the form of a digital voltmeter having essentially four primary operating units. A measuring unit 10 measures an unknown input voltage by the dual slope integration technique and produces a digital output which is proportional to the unknown input voltage. An indicating unit 12 is provided which includes a means for producing a visual digital readout display of the output of the measuring unit 10 following a measurement. In order to rebalance the measuring unit 10 a balancing unit 14 is provided. Finally, a control unit 16 is provided which is connected to the other units, 10, 12, 14 and which controls the sequential operation of the other units using digital logic techniques, during respective measuring and balancing cycles.

Figure 2:
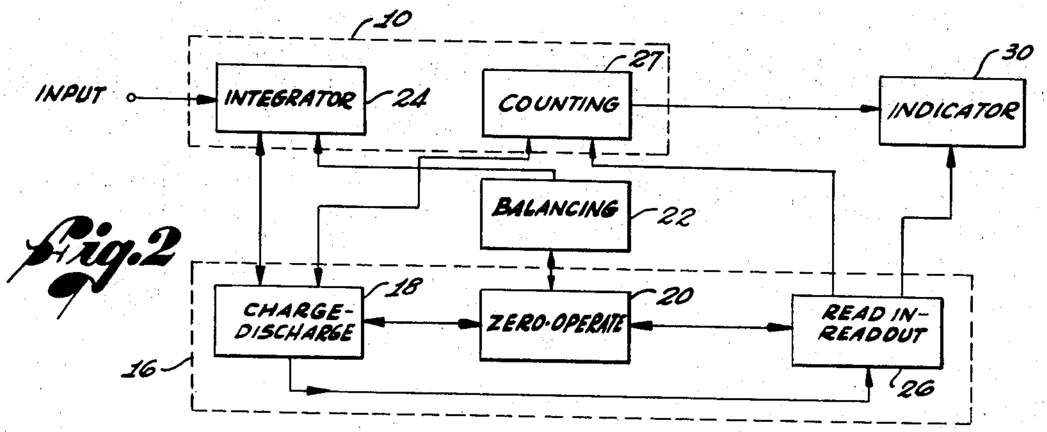
FIG. 2 is a more detailed block diagram of the system of FIG. 1, showing the cooperation between the three main sections of the control unit.

As seen in FIG. 2, the measuring unit 10 generally includes an integrator 24 of the dual slope integrating type and a counting network 27. The counting network 27 of the measuring unit 10 is cooperatively associated with an indicator 30. The control unit 16 (FIG. 2) of the digital voltmeter has three main sections. A charge-discharge control section 18 primarily connects the integrator 24 in either a charge or discharge mode. The charge-discharge control section 18 also provides appropriate control signals to change the condition of other elements of the voltmeter which are dependent on the particular mode of the integrator 24. A zero-operate section 20 operates in conjunction with a balancing section 22 to rebalance the integrator 24 during a balancing cycle before each measuring cycle. A read in-readout section 26 controls the counting network 27 and indicator 30 to change the displayed count in the indicator to that in the counting network after each measuring cycle. The counting network 27 also cooperates with the charge-discharge section 18 to change the condition of the counting network at the appropriate times during the charge and discharge modes of the integrator.

Figure 3:
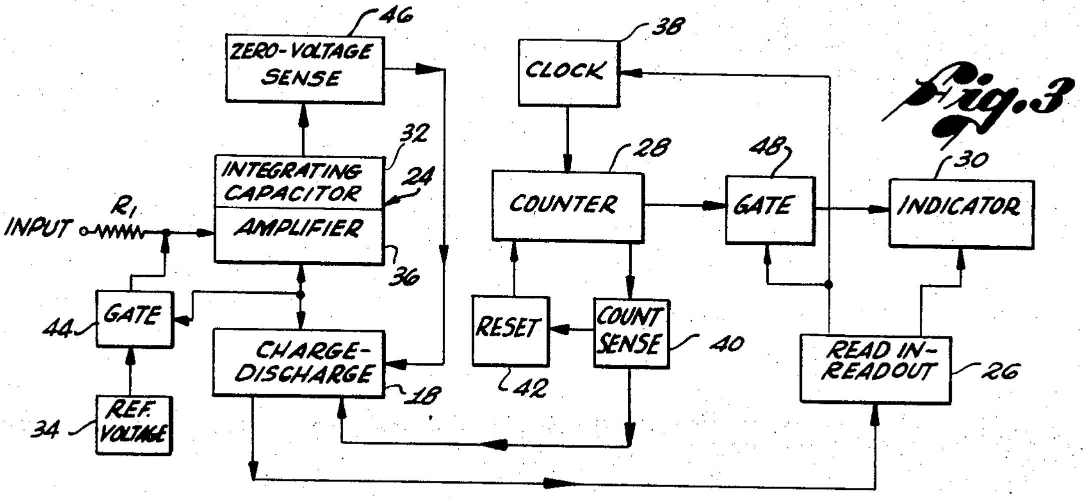
FIG. 3 is a more detailed block diagram illustrating the interconnections between certain of the elements of the system of FIGS. 1 and 2 during the measuring cycle.
Figure 4:
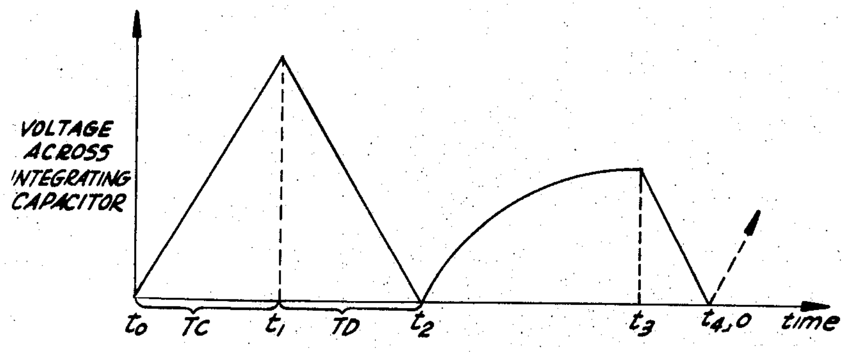
FIG. 4 is a graphical representation of the voltage appearing across the integrating capacitor of the voltmeter for one complete measuring and balancing cycle.

The basic operation of the voltmeter during the measuring cycle is illustrated in FIGS. 3 and 4. In the dual slope integrating technique, an unknown voltage is integrated for a predetermined period of time building up a charge on an integrating capacitor 32 in the integrator 24. Then a reference voltage 34 is integrated to discharge the capacitor 32 back to its zero-voltage level. The second integration period is proportional to the unknown input voltage. This is illustrated mathematically as follows with reference to FIG. 4:

$$\int_{t_0}^{t_1} |V_{in}|dt - \int_{t_1}^{t_2} V_{REF}dt = 0 \quad (1)$$

where, $V_{in}$ is an unknown input voltage, $V_{REF}$ is a reference voltage, $t_0$ is a starting time, $t_1$ is a predetermined time period after the starting time and $t_2$ is the time when the voltage across the capacitor 32 has discharged back to the zero-voltage level.

and $$V_{in}T_C = V_{REF}T_D \text{ where } T_C = t_1 - t_0 \text{ and } T_D = t_2 - t_1 \quad 2$$

Therefore, $$V_{in}(\text{volts}) = \frac{V_{REF}(\text{volts})}{T_C(\text{sec})} \times T_D(\text{sec}) \quad (3)$$

In the digital voltmeter of the present invention, the numerical value of $V_{REF}$ is set equal to the numerical value of $T_C$, or the charge period. Therefore, since $V_{REF}/T_C$ is numerically equal to 1, and since the time terms in equation (3) cancel dimensionally:

$$V_{IN}(\text{volts}) = T_D(\text{volts}) \quad (4)$$

Numerical representations of the time intervals $T_C$ and $T_D$ are obtained by feeding clock pulses to a counter 28 during those periods. It can thus be seen that $T_C$ and $T_D$ actually represent counts in the counter 28 and not a particular interval of time. Therefore, the actual time intervals of $T_C$ and $T_D$ are dependent upon the clock frequency fed to the counter 28. The time required to complete one measurement varies with the unknown input voltage because the time required for count $T_D$ is proportional to the magnitude of the input voltage.

It is possible to control, to an extent, the length of a measurement by increasing or decreasing the frequency of the clock pulses fed to the counter 28. The actual value of the clock frequency depends on the frequency response of the logic elements used and on the gain and limitations of the integrator 24.

From equations (3) and (4) above it can also be seen that the measured input voltage appears as the count in a counter 28 developed during $T_D$. Therefore, the actual frequency of the clock pulses need not be accurately controlled. All that is necessary for accuracy is that the clock frequency remain relatively constant for each complete charge and discharge sequence of a measuring cycle.

Also, since conventional logic elements can be connected to the counter 28 to respond to any count within range of the counter, the magnitude of the reference voltage 34 need not be specially chosen. In the preferred embodiment of the voltmeter, a standard inexpensive reference cell is used which has a voltage of approximately 1.32 volts and the numerical value of the count $T_C$ is set accordingly.

Referring again to FIG. 3, the measuring cycle is performed by applying an unknown input voltage through a resistor $R_1$ to the operational amplifier 36 of the integrator 24. Resistor $R_1$ isolates the input voltage from the other circuit elements connected to the input of the integrator 24. The charge-discharge section 18 is in the "charge" state so that the integrating capacitor 32 is charged while clock pulses are fed from a clock 38 to the counter 28. The read in-readout section 26 is in the "read in" state so the counter 28 is isolated from the indicator 30 by a gate 48. The indicator 30 visually displays the count from the previous measurement, if any.

A conventional count sense logic 40, connected to the counter 28 is set so that when the numerical count in the counter is equal to the numerical value of the reference voltage 34 a count sense signal triggers the charge-discharge section 18 to the "discharge" state and resets the counter through a reset circuit 42 at the same time. The reset circuit 42 may take the form of any conventional circuit means for resetting an electronic counter upon receipt of a signal from the count sense logic 40. When the charge-discharge section 18 switches to the "discharge" state a discharge control signal opens a normally closed gate 44, and the reference voltage 34 is connected to the input to the amplifier 36 through the latter gate. Resistor $R_1$ isolates the input voltage from the input to the integrator 24 when the reference voltage 34 is connected. As the reference voltage 34 is integrated, the integrating capacitor 32 is discharged until it reaches a zero-voltage level and a zero-voltage sense section 46 generates a "zero-voltage" signal to switch the charge-discharge section 18 back to the "charge" state. This switching causes the read in-readout section 26 to switch to the "readout" state which stops the clock pulses and opens the gate 48 between the counter 28 and the indicator 30 to change the displayed count.

Figure 5:
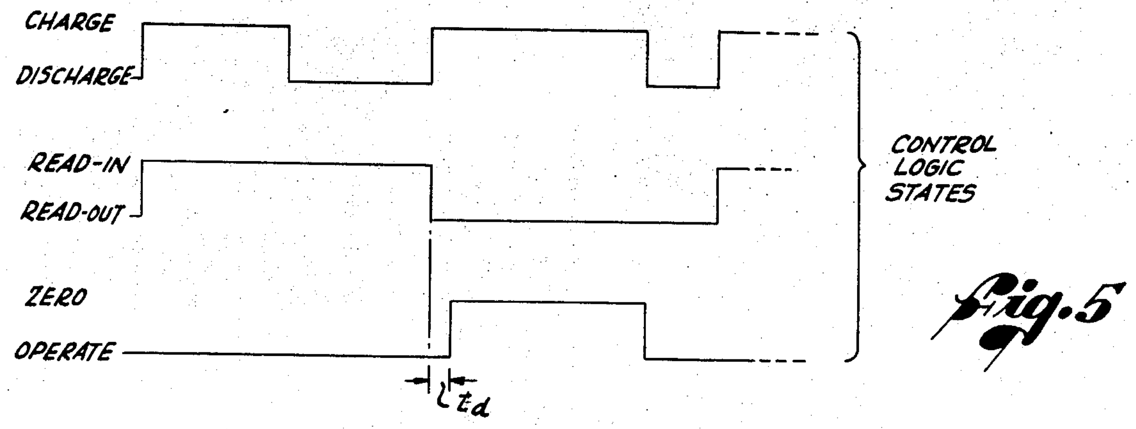
FIG. 5 is a graphical representation of the logic states of the three main sections of the control unit of FIG. 2 for one complete measuring and balancing cycle.
Figure 6:
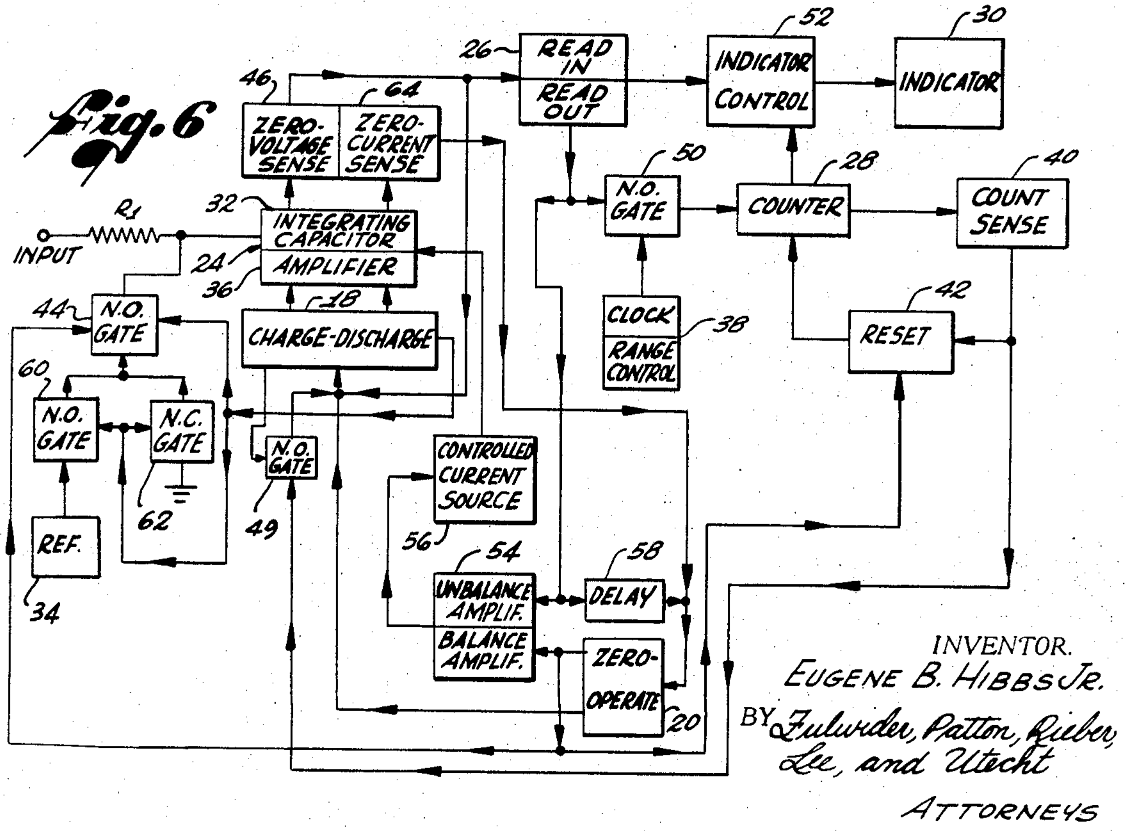
FIG. 6 is a combined electrical schematic and block diagram of a complete analog to digital conversion system.

The logic control during both the measuring and balancing cycles is illustrated in greater detail in FIGS. 4, 5 and 6. Assume that, at the beginning of the measuring cycle, the integrator 24 is balanced, that is, defined by the conditions that the voltage across, and the current through, the integrating capacitor 32 are at some "zero" levels. It should be noted that the "zero" levels need not be actually zero voltage and current but only some predetermined, reproducible value. As used in this description, the terms "zero voltage" and "zero-current" level means such reproducible values.

In operation, the conditions of the three main control sections 18, 20, 26 at the beginning of the measuring cycle are such that the charge-discharge section 18 is in the "charge" state, the read in-readout section 26 is in the "read in" state and the zero-operate section 20 is in the "operate" state. The count in the counter 28 is assumed to be "0" and the counter is isolated from the indicator 30.

Again, the integrator 24 integrates the input voltage and charges the integrating capacitor 32, until the count sense logic 40 senses a numerical count in the counter 28 equal to the numerical value of the reference voltage 34. When the latter predetermined count is reached, a count sense signal triggers the charge-discharge section 18 switching it to the "-discharge" state. The count sense signal activates a normally open gate 49 to close the latter gate during the discharge mode of the integrator 24 and to prevent the count sense signal from triggering the charge-discharge section 18 again during the discharge mode. This is done because the count developed in the counter 28 during the discharge mode may be higher than the predetermined count. Simultaneously, the count sense signal activates a reset section 42 to reset the counter to "0."

When the charge-discharge section 18 switches to the "discharge" state the input of the integrator 24 is again connected to the reference voltage 34.

In the discharge mode, the polarity of the reference voltage 34 is such that, when the reference voltage is integrated, the integrating capacitor 32 is charged in a direction opposite to that of the charge mode so that the integrating capacitor is discharged. The capacitor 32 is discharged until a zero-voltage level is sensed by a zero-voltage sense section 46. It should be appreciated that, practically, the zero-voltage level is actually a small voltage which affects the zero-voltage sense section 46 the same way for each measurement. The latter section 46 develops a zero-voltage signal which is then applied, simultaneously, to the charge-discharge section 18, to switch it back to the "charge" state, and to the read in-readout section 26 switching it to the "readout" state, as shown by the logic state diagram of FIG. 5.

When the read in-readout section 26 switches to the "readout" state, a readout signal closes a normally open clock gate 50 between the clock 38 and the counter 28 stopping the flow of clock pulses to the counter and thereby freezing the last count registered in the counter. The readout signal also activates an indicator control section 52 which changes the number displayed in the indicator 30 to that in the counter 28. The indicator control section 52 as well as the indicator 30 may be of any conventional design suitable for visually and digitally displaying the numerical count in the counter 28, though other means of indicating or utilizing the count may be employed.

When the changing of the count in the indicator 30 is completed, the measuring cycle is completed and the balancing cycle is started. The balancing unit 14 of FIG. 1 is then activated.

As discussed above, one of the principles of operation of the voltmeter constructed according to the present invention is that the integrator 24 remains substantially balanced during a complete measuring cycle. To insure that the integrator 24 remains balanced, however, it is rebalanced before each subsequent measurement.

As the operational amplifier 36 of the integrator 24 is still substantially balanced at the end of the measuring cycle, in order to effectively balance the amplifier, it has been found desirable to first unbalance the amplifier slightly. To accomplish this, the readout signal from the read in-readout section 26 is first applied to an unbalance-balance section 54, switching it to an "unbalance" state, which activates a controlled current source 56 connected to the integrator 24 to slightly unbalance the amplifier 36 momentarily.

To allow the amplifier 36 to be unbalanced, and to allow sufficient time for the count in the counter 28 to be transferred to the indicator 30, the readout signal is delayed slightly, indicated as $t_d$ in FIG. 5, by a suitable time delay circuit 58 before it triggers the zero-operate section 20 to the "zero" state to generate a zero signal. The actual time delay depends on the particular design of the voltmeter and its component parts but is normally quite short in relation to the time required for a practical measurement. In the illustrated preferred embodiment, the time delay is approximately 15 milliseconds.

The zero signal is applied to the unbalance-balance section 54 changing its state to "balance" which, in turn, activates the controlled current source 56 to rebalance the now unbalanced amplifier 36.

The zero signal also activates a combination of gates 44, 60, 62 to connect the input of the integrator 24 to ground during the balancing of the amplifier 36. The normally closed gate 44 is in series between the input to the integrator 24 and the pair of parallel gates 60, 62. One of the parallel gates 60 is normally closed and is connected to the reference voltage 34 and the other parallel gate 62 is normally open and is connected to ground.

The discharge signal activates all three of the integrator input gates 44, 60, 62 to connect the input of the integrator 24 to the reference voltage 34. The series normally closed gate 44 is opened along with the normally closed gate 60 connected to the reference voltage 34. At the same time the parallel normally open gate 62 is closed. The zero signal only opens the normally closed series gate 44 to connect the input to the integrator 24, through the parallel normally open gate 62, to ground.

The unbalance-balance section 54 varies the controlled current source 56 until the current through the integrating capacitor 32 is at a zero-current level, indicating a balanced amplifier. Zero-current level through the integrating capacitor 32 is reached at time $t_3$ in FIG. 4 as the point where the voltage across the capacitor reaches a constant value. A zero-current sense section 64 sends a zero-current signal to the zero-operate section 20 switching it to the "operate" state. At this point, the controlled current source 56 is maintained at a constant value to maintain the amplifier 36 substantially in balance until the next balancing cycle.

The unbalance-balance section 54 and zero-operate section 20 may typically be a pair of flip-flop circuits with their outputs connected to the controlled current source 56 to effect the rebalancing of the integrator 24 upon receiving the proper input signals as discussed above.

It should be noted that while the zero-current level through the capacitor 32 was being set, there was a voltage buildup across the capacitor in the usual direction for the charge mode and this voltage must be discharged down to the zero-voltage level before a subsequent measuring cycle can begin. To accomplish this, the operate signal is applied to the charge-discharge section 18 to switch it to the "discharge" state. The discharge signal then switches the normally closed series gate 44 open, switches the normally open parallel gate 62 closed and switches the normally closed gate 60 open to connect the reference voltage 34 to the integrator 24 to discharge the capacitor 32.

The capacitor 32 is discharged, as discussed above for the measuring cycle, until the zero-voltage level is reached and the zero-voltage sense section 46 develops a zero-voltage signal which switches the charge-discharge section 18 to the "charge" state, in turn switching the integrator 24 back to the charge mode. With the discharge signal removed, gate 44 returns to its normally closed state, disconnecting the reference voltage 34 from the input to the integrator 24 and thereby connecting the input of the integrator to the unknown input voltage through resistor $R_1$. The zero-voltage signal also switches the read in-readout section 26 back to "read in." As the readout signal is then deactivated, the clock gate 50 between the clock 38 and the counter 28 is opened so that clock pulses are again fed to the counter, beginning another measuring cycle.

It will be appreciated that the greatest accuracy of voltage reading will be obtained when all of the available digit positions of the indicator 30 are filled with a significant digit. This in turn depends on the counter 28 receiving a sufficient number of clock pulses during the discharge mode of the measuring cycle. This is insured by the automatic range changing feature of the voltmeter constructed according to the present invention.

The magnitude of the unknown input voltage is variable and the need for a number of different ranges for the voltmeter is illustrated by the fact that, if the input voltage is relatively high, the voltage across the capacitor 32 at the end of the charge mode could be high enough so that, in the discharge time required, the clock pulses fed to the counter 28 would completely fill it and another count would begin before the end of the discharge period. Conversely, if the input voltage is low after the charge period, the low voltage across the capacitor 32 could be discharged before a sufficient number of clock pulses are fed to the counter 28 to register a significant number of digits.

From the discussion above concerning the actual length of the charge and discharge periods it will be seen that the actual charge time depends on both the predetermined number in the count sense logic 40 and the frequency of the clock pulses. The digital voltmeter of the present invention provides different ranges by changing the clock frequencies during the charge and discharge periods, respectively.

Thus, for a high input voltage, a higher clock frequency is applied to the counter 28 during the charge period and the predetermined count corresponding to $T_C$ will be reached in a shorter time period, switching the integrator 24 to the discharge mode before the voltage across the capacitor 32 reaches an excessive value.

If the voltage across the capacitor 32 is relatively low when the $T_C$ count is reached, the higher clock frequency is fed to the counter 28 during the discharge mode to fill the counter with enough pulses during the relatively short discharge period to ensure an output count which produces an adequate number of significant digits.

For unknown input voltages of average value for the voltmeter, the same clock frequency is fed to the counter 28 during both the charge and discharge periods. Thus it can be seen that high, mid and low ranges are provided for the voltmeter constructed according to the present invention by changing the clock frequency fed to the counter 28 during the charge and discharge periods.

In order to utilize a simple decimal point change in the number registered in the digital display, a 10:1 ratio between the charge and discharge clock frequencies is used in the preferred embodiment of the digital voltmeter. The relationship between the discharge count and the unknown input voltage can be illustrated mathematically as follows:

From equation (3) above and for low clock frequencies for both the charge and discharge periods $$V_{IN}=\frac{V_{REF}}{T_C}\times T_D$$

and equation (4)

$V_{IN}=T_D$ set as the mid or 1.0 volt range.

If the high frequency clock pulses are fed to the counter 28 during the charge period, the $T_C$ count is reached in 1/10 of the original $T_C$ time. Thus (5)
$$V_{IN}=\frac{V_{REF}}{T_{C/10}}\times T_D$$

or $V_{IN}=10T_D$ set as the high or 10.0 volt range. (6)

If the high frequency clock pulses are fed to the counter 28 during the discharge period, the $T_D$ count is 10 times larger than the normal $T_D$ count so (7)
$$V_{IN}=\frac{V_{REF}}{T_C}\times T_{D/10} \text{ or}$$

$V_{IN}=(1/10)T_D$ set as the low or 0.1 volt range. (8)

The range of the voltmeter is set by sensing an over or under-range condition and automatically changing the relative frequency of the clock pulses fed to the counter 28 during the charge and discharge periods, respectively. Thus, the range of the digital voltmeter may be changed without changing the direct connection between the unknown input voltage and the input to the integrator 24, thereby eliminating costly precision attenuators in the input circuit of the voltmeter.

In the preferred embodiment of the digital voltmeter, the scale factors between the ranges of the voltmeter vary by a factor of 10 as shown by equations (4), (6) and (8) above. Therefore, the range of the voltmeter may be indicated by the position of the decimal point of the visual readout display and suitable logic circuitry may be provided in the indicator control 52 and indicator 30 for detecting the proper range and displaying a decimal point in the proper position.

Figure 7:
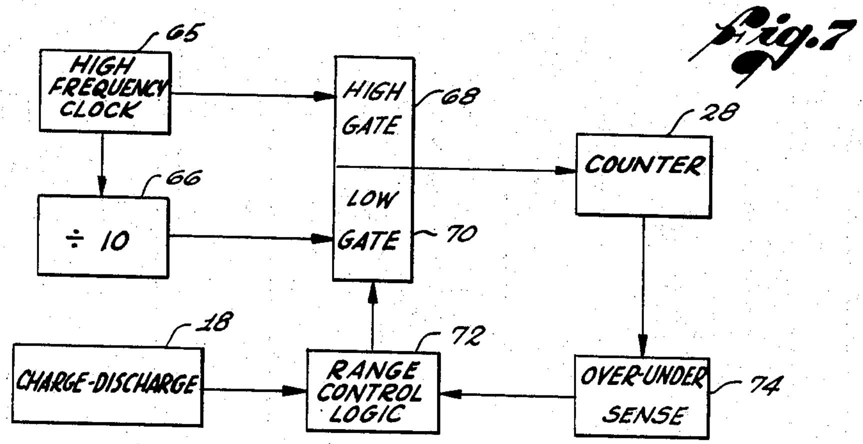
FIG. 7 is a block diagram of a range changing system in accordance with the present invention.
Figure 8:
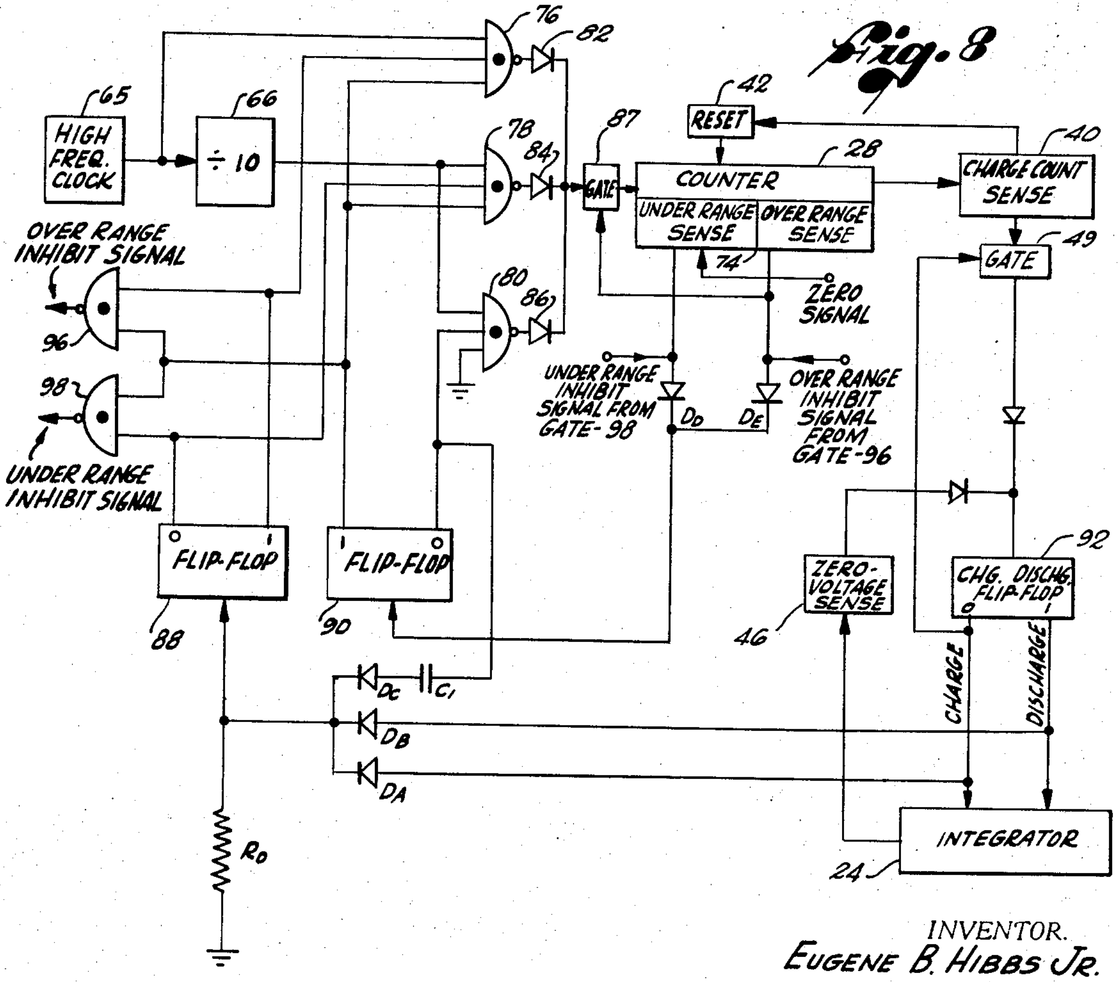
FIG. 8 is a more detailed combined electrical circuit and block diagram of the range changing system of the present invention.

The operation of the range changing control of the voltmeter can best be understood by reference to FIGS. 7 and 8 in which the clock gate 50, indicator control 52 and indicator 30, associated with the counter 28, have been deleted for simplicity. FIG. 7 shows the basic arrangement includes a high frequency clock 65 and a divide-by-10 counter 66 for producing the high and low clock frequencies respectively. The high and low clock frequencies are fed to the counter 28 through high and low gates 68, 70, respectively, which are controlled by a range control logic 72. The range control logic 72, in turn, is controlled by both the charge-discharge section 18 and an over-under-range sense logic 74 connected to the counter 28. The over-under-range sense logic 74 may be any conventional logic network connected to the counter 28 which can produce an output if the count in the counter is above or below a predetermined range.

The charge-discharge section 18 determines when the range control logic sequentially switches high and low gates 68, 70 either open or closed. If the voltmeter is not in the proper range, either an over or under-range sense signal will change the sequence of opening or closing of the gates 68, 70.

The operation of the range control logic 72 is illustrated in more detail in FIG. 8. In addition to the high frequency clock 65 and the divide-by-10 counter 66 supplying the high and low frequency clock pulses, respectively, the range control logic 72 includes three NAND gates 76, 78, 80 each having three inputs and which produce a "1" output when all three respective inputs are at the "0" level. Otherwise the output of the gates 76, 78, 80 is "0". The outputs of the NAND gates 76, 78, 80 are fed through isolating diodes 82, 84, 86 commonly through normally open gate 87 to the counter 28. The high frequency clock pulses are fed only to one input of the first NAND gate 76 and the low frequency clock pulses are fed to an input of both the second and third NAND gates 78, 80, respectively.

A ranging flip-flop 88 has its outputs connected to inputs of the first and second NAND gates. A range change flip-flop 90 has one of its outputs connected to both remaining inputs of the first and second NAND gates 76, 78, respectively, and its other output connected to an input to the third NAND gate 80. The remaining input to the third NAND gate 80 is connected to ground or the "0" level.

The ranging flip-flop 88 receives triggering pulses through isolating diodes $D_A$ and $D_B$ from both of the outputs of a charge-discharge flip-flop 92, the state of which defines the charge and discharge modes for the voltmeter as discussed above. Flip-flop 88 then follows the changes in the state of the charge-discharge flip-flop 92. The range change flip-flop 90 is triggered by over or under range signals generated by the over-under range sense logic 74 and fed to the input of the range change flip-flop 90 through isolating diodes $D_D$ and $D_E$.

When the state of the range change flip-flop 90 is such that the "0" level output of flip-flop 90 is connected to the third NAND gate 80, that gate is "enabled" to pass clock pulses and the first and second NAND gates 76, 78 are "disabled" by the "1" output of flip-flop 90. Since flip-flop 90 does not change state during the charge and discharge mode changes, it can be seen that the low frequency clock pulses will be fed to the counter 28 through the third NAND gate 80 during both the charge and discharge modes of the voltmeter. From the above discussion it will be seen that this defines the mid or 1.0 volt range for the voltmeter.

If the range is incorrect, flip-flop 90 receives a triggering pulse from the under or over-range sensing logic 74 and its state is changed. In this condition, the first and second NAND gates 76, 78 are enabled and the third NAND gate 80 is disabled. The high or low frequency clock pulses will then be sequentially fed through the first or second NAND gates 76, 78 depending upon the respective output levels of flip-flop 88 during the charge and discharge states of flip-flop 92.

If the high frequency clock pulses are fed to the counter 28 during the charge mode then, when flip-flop 88 changes state for the discharge mode, low frequency clock pulses will be fed to the counter 28 during the discharge mode. Again, it should be noted that this sequence of clock pulse frequencies defines the high or 10.0 volt range for the voltmeter.

Conversely, depending upon the respective output levels of flip-flop 88, it is also possible that the counter would be fed low frequency pulses during the charge period and high frequency pulses during the discharge period, and that this relationship defines the low or 0.1 volt range for the voltmeter.

Thus, it can be seen that when the first and second NAND gates 76, 78 are enabled the voltmeter will be in either the 10.0 volt range or the 0.1 volt range depending upon the relative output levels of the ranging flip-flop 88, during the charge and discharge periods and, when only the third NAND gate 80 is enabled, the voltmeter is in the 1.0 volt range. Because the ranging flip-flop 88 changes state the same number of times as the integrator 24 changes charge and discharge modes during one complete measuring and balancing cycle, in the absence of any over or under-range triggering pulses the same sequential clock frequency relationship for the charge and discharge periods will be maintained for successive complete cycles.

However, if an over or under-range is sensed, flip-flop 90 is triggered, changing the range. Assuming that the voltmeter was originally in the 1.0 volt range, triggering flip-flop 90 would change the voltmeter to either the 10.0 volt range or the 0.1 volt range, depending on the relative sequential output levels of flip-flop 88. If the second range is also incorrect flip-flop 90 is triggered again changing it back to the 1.0 volt range. So that subsequent triggering of flip-flop 90 will not change flip-flop 88 back to the same sequence again, an auxilliary pulse derived from flip-flop 90 when it changes state, triggers flip-flop 88 an additional time between pulses from flip-flop 92. The additional change of state of flip-flop 88, changes the relative sequential output level change of flip-flop 88, and the clock frequency sequence, when flip-flop 90 switches out of the 1.0 volt range. Therefore, the range of the voltmeter changes between the high and low ranges by going through the center or mid range.

In order to prevent the range of the voltmeter from continually oscillating if the input voltage is above or below the effective range of the voltmeter, over and under-range inhibit signals are logically derived from inhibit NAND gates 96, 98 each of which has two inputs connected to the outputs of flip-flop 88 and flip-flop 90 as described below. The appropriate inhibit signal prevents the over-under-range sense logic 74 respectively, from triggering flip-flop 90.

To illustrate the operation of the range changing logic of the voltmeter in more detail, assume that it is in the 1.0 volt range with the "0" output of flip-flop 90 connected to the third NAND gate 80 at the beginning of the charge mode for the measuring cycle. NAND gate 80 is therefore enabled, as discussed above. Further, assume that the "0" output of flip-flop 88 is connected to the second NAND gate 78 for the charge period. Note that both the first and second NAND gates 76, 78 are disabled by the "1" output of flip-flop 90. Also, assume that the input voltage is below the effective range of the voltmeter.

As described above, the integrating capacitor 32 is charged while the low frequency clock pulses are fed to the counter 28. When the predetermined count is sensed, the charge count sense signal switches the integrator 24 into the discharge mode and resets the counter 28. When the charge-discharge flip-flop 92 changes to the discharge state, flip-flop 88 also changes state, but, since both the first and second NAND gates 76, 78 are disabled, the low frequency clock pulses are fed through the third NAND gate 80 to the counter 28 during the discharge mode.

The integrating capacitor 32 is discharged until the zero-voltage signal switches the integrator 24 back to the charge mode for the balancing cycle as described above. Again, the ranging flip-flop 88 changes state with the charge-discharge flip-flop 92. After the short delay at the beginning of the balancing cycle described above, the zero signal activates the over-under-range sense logic 74 and, since the count in the counter 28 is below optimum, an under-range signal is generated and flip-flop 90 is triggered.

When flip-flop 90 changes state, the first and second NAND gates 76, 78 are enabled and the third NAND gate 80 is disabled. Also, when the output of flip-flop 90 which is connected to the third NAND gate 80 goes from the "0" to the "1" level, an auxilliary pulse, fed through a capacitor $C_1$ and diode $D_C$ triggers flip-flop 88 changing its state an additional time. The polarity of diode $D_C$ is such that the auxilliary pulse is generated only when the output of flip-flop 90 connected to the third NAND gate 80 goes from the "0" to the "1" level. The over-under range sense logic 74 is activated to generate an under-range signal only after the short delay to insure that the under-range signal does not arrive substantially coincidentally with the trigger pulse from the charge-discharge flip-flop 92 which could result in flip-flop 88 not being triggered the extra additional time.

It can be seen that, during the balancing cycle, the state of flip-flop 88 will be changed twice more before the charge mode of the measuring cycle begins again. It should be noted that, because the count in the counter 28 is read out and the counter reset during the balancing cycle, the over-under range sense logic 74 is inactive.

Because flip-flop 88 has been triggered an additional time by the auxilliary pulse, the output level sequence of flip-flop 88 is such that the "0" output is connected to the first NAND gate 76 for the charge mode of the second measuring cycle. Therefore, the high frequency clock pulses are fed to the counter 28 during the charge mode and low frequency clock pulses will be fed to the counter during the discharge mode, so that the voltmeter is in the 10.0 volt range.

When the voltmeter again enters the balancing cycle the zero signal again activates the over-under-range sense logic 74, generating an under-range signal which again triggers flip-flop 90. This switches the voltmeter back to the 1.0 volt range but, because the output of flip-flop 90 connected to the third NAND gate 80 goes from the "1" level to the "0" level, no auxilliary pulse is transferred to flip-flop 88. After completion of the second balancing cycle, the voltmeter then enters the third measuring cycle.

Following the third measuring cycle, in the 1.0 volt range, the zero signal again activates the over-under-range sense logic 74 generating an under-range signal which again triggers flip-flop 90. Because the output of flip-flop 90 connected to the third NAND gate 80 goes from the "0" level to the "1" level, an auxilliary pulse is again generated, changing the output level sequence of flip-flop 88. Therefore, when the fourth measuring cycle begins, the "0" output of flip-flop 88 is connected to the second NAND gate 78 to feed low frequency clock pulses to the counter 28 during the charge mode and to feed high frequency clock pulses to the counter during the discharge mode. Thus, the voltmeter is in the lowest or 0.1 volt range.

Since the input voltage is assumed to be below the effective range of the voltmeter, the over-under-range sense logic 74 would again generate an under-range signal at the beginning of the next balancing cycle starting the range changing sequence all over again. In order to prevent the subsequent under-range signal from triggering flip-flop 90, an under-range inhibit signal is derived from the additional NAND gate 98 which has its two inputs connected to the "1" output of flip-flop 88 and the "0" output of flip-flop 90, resulting in a "0" output from the gate which, when connected between the over-under-range sense logic 74 and isolating diode $D_D$, inhibits the under-range signal. The voltmeter then continues to operate in the 0.1 volt range.

The above-described range changing sequence illustrates the maximum change limiting time. That is, it represents the greatest number of times the range of the voltmeter would have to be changed to find the correct range. Thus, the voltmeter will be in the correct range within a maximum of four measuring cycles and it is quite possible that the correct range could be found with no, or only one, range change.

The operation of the range-changing logic 72 of FIG. 7 is somewhat different when the input voltage is above the highest available range. The over-under-range sense logic 74 operates to generate an over-range signal before the completion of the discharge mode because the counter 28 might be completely filled and a new count started before the end of the discharge period, resulting in an erroneous measurement. In FIG. 8, during the discharge mode, if the count in the counter reaches a certain predetermined value near the maximum count, an over-range signal is developed by the over-under-range sense logic 74 which both disables the normally open gate 87 between the NAND gates 76, 78, 80 and the counter 28 stopping the count in the counter. The over-range signal also triggers flip-flop 90 changing its state and possibly generating an auxilliary pulse to change the state of flip-flop 88, as described above.

Activating the over-under-range sense logic 74 before the end of the discharge period also ensures that the over-range signal triggers flip-flop 90 and, if an auxilliary pulse is generated, that it triggers flip-flop 88 some time prior to the discharge signal thereby preventing coincident arrival of the two signals, as discussed above regarding the under-range situation. Again, when the voltmeter is in the highest range the "0" output of flip-flop 88 and the "1" output of flip-flop 90, are connected to the two inputs of the additional over-range inhibit NAND gate 96 to generate a "0" output which is connected between the over-under-range sense logic 74 and diode $D_E$ to inhibit the over-range signal.

As mentioned above, in order that positive, negative or alternating unknown input voltages may be directly applied to the input of the integrator 24, the integrating capacitor 32 is connected in a full wave bridge during the charge mode to charge the capacitor in only one direction. The capacitor 32 then is connected for discharge during the discharge mode when the reference voltage 34 is applied to the input of the integrator. The operation of a bridge circuit 102 of the preferred embodiment can be more readily understood by reference to FIG. 9.

The unknown input voltage is applied to the input of the operational amplifier 36 through the isolating input resistor $R_1$. The output of the operational amplifier 36 is applied to one side of the bridge circuit 102 and the other side of the bridge is connected back to the input of the amplifier. A feedback resistor $R_2$ is connected between the input of the amplifier 36 and the ground point.

When connected as a full wave bridge, the bridge circuit 102 operates as if it contained the conventional four diodes rectangularly arranged with the operational amplifier 36 output and input connected across one diagonal and the integrating capacitor $C_2$ connected across the other diagonal. However, because zero-voltage and zero-current must be sensed, other semi-conductor devices have been substituted for two of the diodes in the practical bridge circuit 102 shown in FIG. 9.

One leg 104 of the bridge circuit 102 has conventional diodes $D_1$ and $D_2$ connected in series, the sum of their forward voltage drops being selected to balance other voltages within the circuit. A second leg 106 of the bridge circuit 102 has another conventional diode $D_3$ with a transistor $Q_1$ connected across it. Transistor $Q_1$ is an N-channel depletion junction field effect transistor and, when the integrator 24 is in the charge mode, a sufficiently high negative bias is applied to the gate of transistor $Q_1$ to result in its source to drain circuit being essentially an open circuit. Under this condition, the diode $D_3$ of the second leg 106 of the bridge circuit 102 operates in a conventional manner in that it will allow current to flow in only one direction.

The diode of the third leg 108 of the bridge circuit 102 is formed by the base to collector junction of a junction transistor $Q_2$ with the collector of the transistor connected to the capacitor $C_2$ and the base connected to the return line 109 to the operational amplifier 36. It will be appreciated that when the potential at the emitter of transistor $Q_2$ is such that the collector to emitter circuit of the transistor is off, the base to collector circuit of the transistor forms a diode with the base forming the cathode and the collector forming the anode of the diode. Thus positive current will flow from the base to the collector but will not flow in the opposite direction. When the bridge circuit 102 is functioning as a full wave bridge, the collector to emitter circuit of transistor $Q_2$ is maintained off so that the transistor functions as the diode of the third leg 108 of the full wave bridge.

Figure 10:
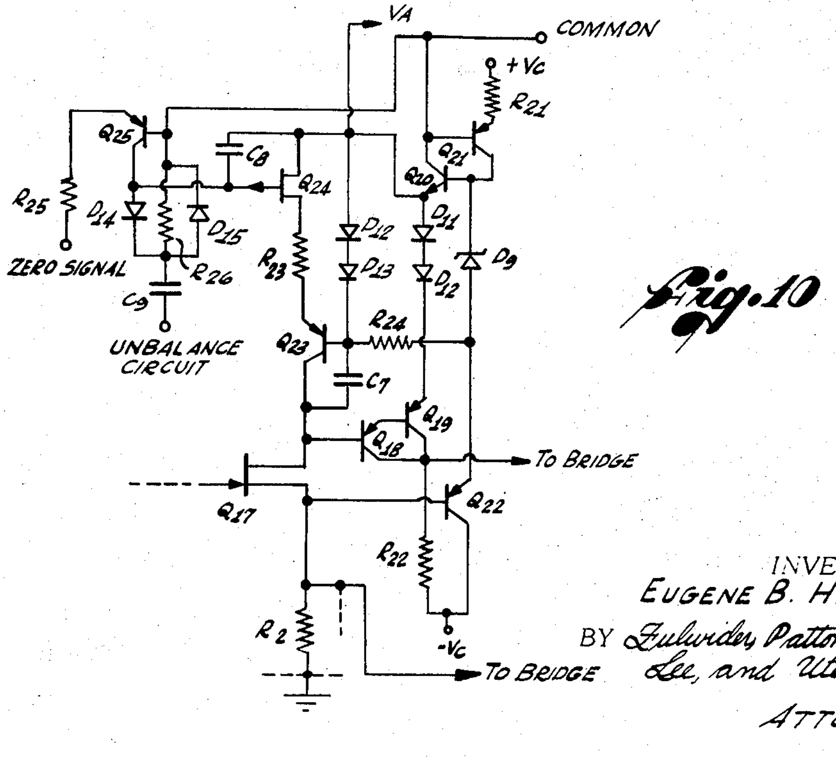
FIG. 10 is an electrical schematic of the operational amplifier of the present invention, including the automatic rebalancing circuit.

The diode of a fourth leg 110 of the bridge circuit 102 is formed by the series connected base to emitter circuits of three transistors $Q_3$, $Q_4$ and $Q_5$ connected in a Darlington circuit. The collectors of transistors $Q_3$ and $Q_4$ are connected to a regulated positive voltage supply $+V_A$. The voltage supply $+V_A$ is obtained from a point within the operational amplifier 36 circuit as illustrated in FIG. 10 to maintain a voltage balance between the operational amplifier and the fourth leg 110 of the bridges 102.

The collector of transistor $Q_5$ is connected to the positive power supply $+V_C$ through an isolating voltage divider of resistors $R_3$ and $R_4$ connected in series. The zero-current signal, which is the output of the zero-current sense section 64 of FIG. 5, is derived from the junction of resistors $R_3$ and $R_4$.

The current gain of transistors $Q_3$, $Q_4$ and $Q_5$ is such that the transistors are saturated for relatively small currents through the fourth leg 110 of the full wave bridge. Thus, in order for a voltage change to appear at the junction of resistors $R_3$ and $R_4$, to develop a zero-current sense output signal, the currents through the base to emitter circuit of transistor $Q_3$ must change from a relatively low current to a current of practically zero. Thus, when the polarity of the input voltage to the operational amplifier is such that current flows through the first leg 104, the integrating capacitor $C_2$ and the fourth leg 110 of the bridge circuit 102, the zero-current level through the capacitor will be indicated by the voltage transition taking place at the junction of resistors $R_3$ and $R_4$ as the base to emitter current through transistor $Q_3$ goes from a relatively small current to practically "zero" current. It will be appreciated that the current through the capacitor $C_2$ when the zero-current sense output signal is developed need not be actually zero current but only a very small predetermined current value which results in the generation of the zero-current signal every time.

Figure 9:
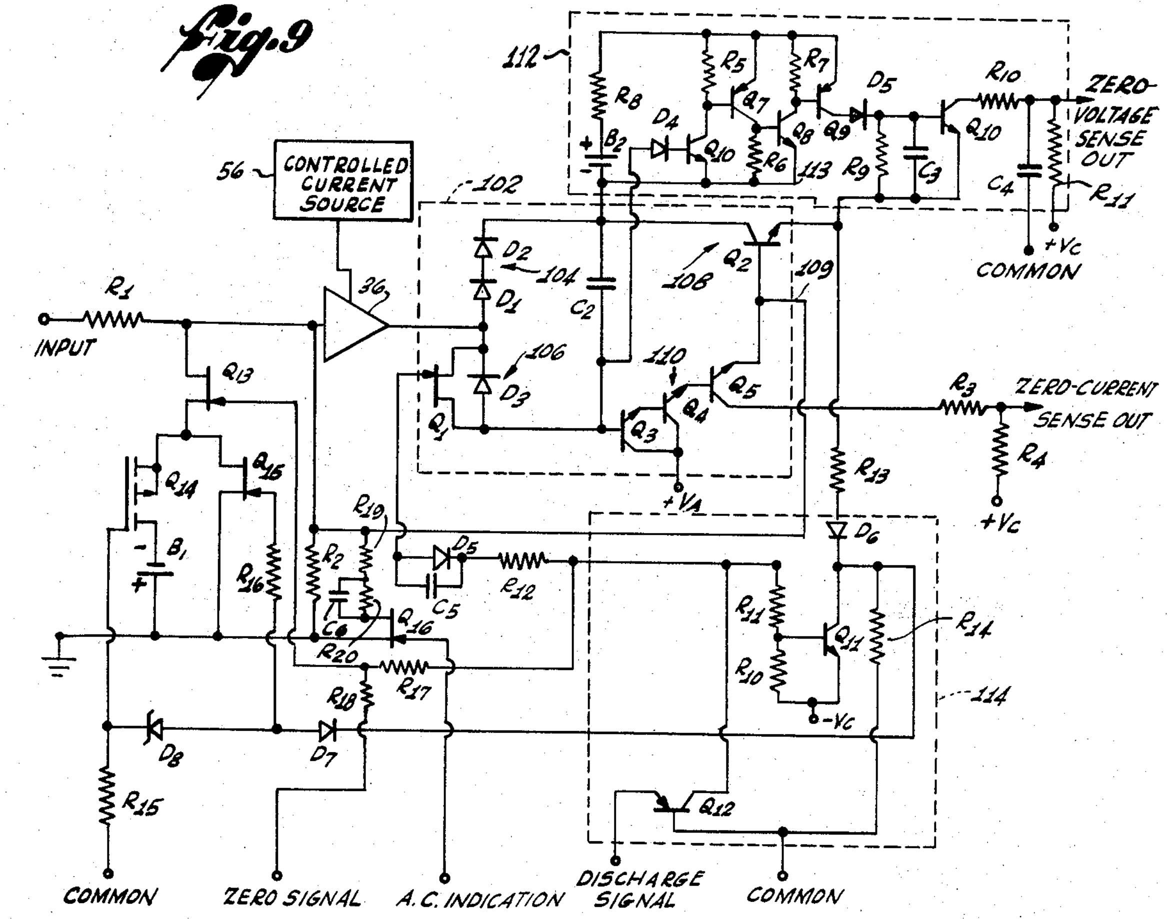
FIG. 9 is a combined electrical schematic and block diagram of an integrator employed in a digital voltmeter constructed in accordance with the present invention.

The zero-voltage level across the integrating capacitor $C_2$ is sensed by an operational amplifier 112 connected across the capacitor, as shown in FIG. 9. The zero-voltage sensing operational amplifier 112 corresponds to the zero-voltage sense section 46, shown in FIGS. 3 and 6. The operational amplifier 112 has two sections one of which is self-powered by an auxiliary battery $B_2$, and a second section which is operational only during the discharge mode of the integrator 24 when it is needed.

The first section of the operational amplifier 112 is a direct coupled, cascaded amplifier including transistors $Q_6$, $Q_7$, $Q_8$ and $Q_9$ and resistors $R_5$, $R_6$ and $R_7$. The input to the base of transistor $Q_6$ is connected to one side of capacitor $C_2$ through diode $D_4$ and the other side of the capacitor is connected to a common point 113 for the amplifier 112. Auxiliary battery $B_2$ is connected to the amplifier 112 through resistor $R_8$.

The output of the first section, at the collector of transistor $Q_9$, is connected through a diode $D_5$ to the base of a transistor $Q_{10}$ which forms the second section of the amplifier 112. A resistor $R_9$ and a capacitor $C_3$ are connected in parallel between the base and emitter of $Q_{10}$. The emitter of transistor $Q_{10}$ is also connected to the emitter of transistor $Q_2$ in the bridge circuit 102. The collector of transistor $Q_{10}$ is connected to the positive voltage supply $+V_C$ through the voltage divider consisting of resistors $R_{10}$ and $R_{11}$ connected in series.

The zero-voltage signal is taken from the junction of resistors $R_{10}$ and $R_{11}$. Extraneous voltage transients at the junction of resistors $R_{10}$ and $R_{11}$ are suppressed by the connection of a capacitor $C_4$ from the junction to the common point.

Again, as described with reference to the zero-current sense section 64, the gain of operational amplifier 112 is such that it produces a voltage change at the junctions of resistors $R_{10}$ and $R_{11}$ only when the voltage across capacitor $C_2$ is at practically "zero" volts. However, it will again be appreciated that the voltage across capacitor $C_2$ which produces the zero-voltage signal need not be actually zero potential. All that is required is that the voltage level across the capacitor which produces the zero voltage signal be the same each time the signal is produced. In this regard, it should be noted that the zero-voltage signal initiates both the start of the charge period and the end of the discharge period of the measuring cycle. Therefore, the potential across capacitor $C_2$ is the same for both the beginning and the end of the measuring cycle so that no error is introduced.

While the bridge circuit 102 is connected as a full wave bridge when the integrator 24 is connected in the charge mode, the capacitor $C_2$ will charge in only one direction regardless of the polarity of the input to the operational amplifier 36. Therefore, when the integrator 24 is switched to the discharge mode, the capacitor $C_2$ must be connected in the bridge circuit 102 so that current flows through the capacitor in the opposite direction for the particular polarity of the reference voltage 34 selected.

In the particular embodiment of the bridge circuit 102 shown in FIG. 9, this is accomplished by effectively shorting the second and third legs 106, 108 of the bridge circuit so that the current can flow in a direction opposite to that in which it would normally flow. Therefore, in the embodiment shown in FIG. 9, a charge-discharge control circuit 114 is provided to maintain the second and third legs 106 and 108 of the bridge circuit 102 in their proper condition for the charge or discharge mode, respectively, of the integrator 24. The charge-discharge control circuit 114 corresponds to the charge-discharge section 18 described above.

As mentioned above, the second leg 106 of the bridge circuit 102 functions as a diode when transistor $Q_1$, connected across diode $D_3$, is maintained in an off condition and the third leg 108 of the bridge circuit 102 functions as a diode when the collector to emitter circuit of transistor $Q_2$ is off. When transistor $Q_1$ is turned on, the second leg 106 of the bridge circuit 102 will conduct current in either direction through the source to drain circuit of the transistor. Also, when the collector to emitter circuit of transistor $Q_2$, which forms the third leg 108 of the bridge circuit 102, is turned on, current can flow, to a degree, in both directions in the base to collector circuit of the transistor. Thus, the third leg 108 can be effectively short circuited.

During the charge mode of the integrator 24, transistor $Q_1$ is maintained in an off condition by connecting a sufficiently high negative bias voltage to its gate. The negative bias voltage is derived from the negative power source $-V_C$ through resistors $R_{10}$, $R_{11}$ and $R_{12}$ connected in series with a diode $D_5$ connected in parallel with a capacitor $C_5$.

The collector to emitter circuit of transistor $Q_2$ is maintained in an off condition by effectively connecting the emitter of the transistor to the common point through resistor $R_{13}$, diode $D_6$ and resistor $R_{14}$ connected in series.

To essentially short circuit the second and third legs 106, 108 of the bridge circuit 112 during the discharge mode of the integrator 24, control junction transistors $Q_{11}$ and $Q_{12}$ are provided in the control circuit 114 to change the voltage at the gate of transistor $Q_1$ and the emitter of transistor $Q_2$, respectively. The collector of transistor $Q_{11}$ is connected to the junction of diode $D_6$ and resistor $R_{14}$, its emitter is connected to the negative voltage source $-V_C$ and its base is connected to the junction of resistors $R_{10}$ and $R_{11}$. The collector of transistor $Q_{12}$ is connected to the junction of resistors $R_{11}$ and $R_{12}$, its base is connected to the common point and its emitter is connected to the discharge signal source.

When the discharge signal appears at the emitter of of transistor $Q_{12}$, the negative voltage at the junction of resistors $R_{11}$ and $R_{12}$ is substantially lowered. This in turn reduces the negative bias on transistor $Q_1$ to substantially zero, the bias voltage being prevented from going positive by diode $D_5$. Transistor $Q_1$ then turns on and shorts out the second leg 106 of the bridge circuit 102.

When control transistor $Q_{12}$ turns on, current is drawn through series resistors $R_{10}$ and $R_{11}$ producing a voltage across resistor $R_{10}$ which turns transistor $Q_{11}$ on. The junction of diode $D_6$ and resistor $R_{14}$ are then connected to the negative supply voltage $-V_C$ through the collector to emitter circuit of transistor $Q_{11}$. The emitter of transistor $Q_2$ in the third leg 108 of the bridge circuit 102 is also drawn toward the negative supply voltage $-V_C$ through resistors $R_{13}$ and diode $D_6$. Transistor $Q_2$ is then turned on which allows current to flow through the base to collector circuit in either direction, effectively shorting out the third leg 108. Thus, when the discharge signal is received by the charge-discharge control circuit 114, the integrating capacitor $C_2$ is connected for discharge through the second and third legs 106, 108 of the bridge circuit 102.

From the above discussion it should be noted that during the charge mode of the measuring cycle the input voltage is applied through the input resistor $R_1$ to the input to the operational amplifier 36. However, during the charge mode of the balancing cycle the input to the operational amplifier 36 is connected to ground so that the input is zero voltage. Finally, for the discharge modes of both the measuring and balancing cycles, the input to the operational amplifier 36 is connected to the reference voltage in order to discharge the capacitor.

To connect the input to the amplifier 36 to these various points, a network of three field effect transistors $Q_{13}$, $Q_{14}$ and $Q_{15}$ are provided between the input to the amplifier and the reference battery $B_1$ and ground point, respectively. Transistors $Q_{13}$, $Q_{14}$ and $Q_{15}$ correspond to gates 44, 60 and 62, respectively, discussed above. Transistor $Q_{13}$ is a junction field effect transistor of the N-channel depletion type and is connected in series with the parallel combination of transistors $Q_{14}$ and $Q_{15}$. Transistor $Q_{14}$ is a metal oxide semi-conductor field effect transistor of the enhancement type and is connected in series with the reference battery $B_1$ and ground. Transistor $Q_{15}$ is a junction field effect transistor of the P-channel depletion type and is connected between transistor $Q_{13}$ and ground.

Transistors $Q_{14}$ and $Q_{15}$ are connected so that when transistor $Q_{14}$ is on, representing a closed circuit, transistor $Q_{15}$ is off, representing an open circuit. The on-off conditions are reversed when transistor $Q_{14}$ is off. The conditions of transistors $Q_{14}$ and $Q_{15}$ are substantially simultaneously changed by the application of the discharge signal to the charge-discharge control circuit 114.

In particular, transistor $Q_{14}$, being of the enhancement type, has its gate normally connected through a resistor $R_{15}$ to the common point, resulting in transistor $Q_{14}$ being off in the absence of the discharge signal. Transistor $Q_{15}$ has its gate connected through a resistor $R_{16}$ and diode $D_7$ to the collector of transistor $Q_{11}$ of the charge-discharge control circuit 114. It will be recalled that, in the absence of the discharge signal, the collector of transistor $Q_{11}$ is at substantially the common point potential. Therefore, the potential applied to the gate of transistor $Q_{15}$ is substantially zero and, being of the depletion type, the transistor will be on. A Zener diode $D_8$ is connected between the gate of transistor $Q_{14}$ and the junction of resistor $R_{16}$ and diode $D_7$ to compensate for the different gate characteristics of the transistors $Q_{14}$ and $Q_{15}$.

The gate of transistor $Q_{13}$ is connected through a resistor $R_{17}$ to the junction of resistors $R_{11}$ and $R_{12}$. The gate of transistor $Q_{13}$ is also connected through a resistor $R_{18}$ to the zero signal source. Therefore, in the absence of a zero signal, when the voltmeter is in the charge mode of the measuring cycle, a relatively high negative potential is supplied through resistor $R_{17}$ to the gate of transistor $Q_{13}$ resulting in the source to drain circuit of the transistor being essentially an open circuit.

When the discharge signal is applied to the charge-discharge control circuit 114, the potential at the junction of resistors $R_{11}$ and $R_{12}$ approaches the common point voltage and the source to drain circuit of transistor $Q_{13}$ becomes an essentially closed circuit. Therefore, when the discharge signal is received by the charge-discharge circuit 114, both transistors $Q_{13}$ and $Q_{14}$ are closed, connecting the reference battery $B_1$ through the transistors to the input of the operational amplifier 36.

When the voltmeter is in the charge mode of the balancing cycle and the zero signal is received, transistor $Q_{13}$ also closes connecting the input of the operational amplifier 36 to ground through the then closed transistor $Q_{13}$ and the normally closed transistor $Q_{15}$.

It will be appreciated that the illustrated and described circuit is only the presently preferred embodiment and many circuit variations are possible.

If the input voltages are alternating, the resultant voltage stored in the integrating capacitor $C_2$ during the charge mode is proportional to the average value of the alternating input voltage. Because the root mean square voltage (RMS) is more commonly used as the measurement of an alternating voltage, it is desirable to modify the gain of the operational amplifier 36 so that the indicated output is proportional to the RMS value of the input voltage.

This is accomplished by providing an auxiliary feedback resistance network in parallel with the feedback resistor $R_2$. Resistors $R_{19}$ and $R_{20}$ are connected in series with the source to drain circuit of a junction field effect transistor $Q_{16}$. A capacitor $C_6$ is connected in parallel across resistor $R_{20}$ to speed up the switching characteristics of transistor $Q_{16}$. The gate of transistor $Q_{16}$ is normally reverse biased so that the source to drain circuit of the transistor is essentially open circuited during normal operation.

If the input voltage is alternating the zero-current sense output at the junctions of the resistors $R_3$ and $R_4$ will produce a periodic output signal in accordance with the frequency of the alternating input signal. The periodic output signal is converted to a direct current voltage by any suitable auxiliary circuitry (not shown) to develop an A.C. indication signal.

The A.C. indication signal is then applied to the gate of transistor $Q_{16}$ causing the source to drain circuit to appear as an essentially closed circuit. Resistors $R_{19}$ and $R_{20}$ are then effectively connected across the feedback resistor $R_{21}$ varying the gain of the operational amplifier 36 by a suitable amount so that the indicated value of the unknown input voltage is the RMS value rather than the average value. Again, the described circuit is only illustrative of the presently preferred embodiment and many circuit variations are possible.

Typical component values for the circuit shown in FIG. 9 are as follows:

| | |
|---|---|
| $R_1$ | 4 Megohm |
| $R_2$ | 47 Kilohm |
| $R_3$ | 47 Kilohm |
| $R_4$ | 10 Kilohms |
| $R_5$ | 1.5 Megohm |
| $R_6$ | 480 Kilohms |
| $R_7$ | 47 Kilohms |
| $R_8$ | 1 Kiohm |
| $R_9$ | 47 Kilohms |
| $R_{10}$ | 47 Kilohms |
| $R_{11}$ | 10 Kilohms |
| $R_{12}$ | 1 Megohm |
| $R_{13}$ | 22 Kilohms |
| $R_{14}$ | 100 Kilohms |
| $R_{15}$ | 470 Kilohms |
| $R_{16}$ | 1 Megohm |
| $R_{17}$ | 1 Megohm |
| $R_{18}$ | 1 Megohm |
| $R_{19}$ | 10 Kilohms |
| $R_{20}$ | 220 Ohms |
| $Q_1$ | MFE 2095 (Motorola) |
| $Q_2$ | 2N4124 (Motorola) |
| $Q_3$ | 2N4124 (Motorola) |
| $Q_4$ | 2N4124 (Motorola) |
| $Q_5$ | MPS 6521 (Motorola) |
| $Q_6$ | 2N4410 (Motorola) |
| $Q_7$ | MPS6523 (Motorola) |
| $Q_8$ | 2N4124 (Motorola) |
| $Q_9$ | MPS6523 (Motorola) |
| $Q_{10}$ | 2N4410 (Motorola) |
| $Q_{11}$ | 2N4410 (Motorola) |
| $Q_{12}$ | 2N5089 (Motorola) |
| $Q_{13}$ | MFE 2095 (Motorola) |
| $Q_{14}$ | MPF160 (Motorola) |
| $Q_{15}$ | MPF105 (Motorola) |
| $D_1$ | IN459 (Texas Instruments) |
| $D_2$ | IN459 (Texas Instruments) |
| $D_3$ | IN459 (Texas Instruments) |
| $D_4$ | IN914 (Texas Instruments) |
| $D_5$ | IN459 (Texas Instruments) |
| $D_6$ | IN914 (Texas Instruments) |
| $D_7$ | IN914 (Texas Instruments) |
| $D_8$ | MZ500 (Motorola) |
| $C_1$ | 330 picofarads |
| $C_2$ | 4 microfarads |
| $C_3$ | 33 picofarads |
| $C_4$ | 300 picofarads |
| $C_5$ | 33 picofarads |
| $C_6$ | 100 picofarads |
| $V_C$ | 40 volts |
| $B_1$ | 1.32 volt mercury battery |
| $B_2$ | 1.32 volt mercury battery |

As described above, during the balancing cycle, a controlled current source 56 is connected to the operational amplifier 36 to momentarily unbalance the amplifier and then rebalance the amplifier until the zero-current level through the capacitor $C_2$ is sensed. FIG. 10 illustrates the operational amplifier 36 portion of the voltmeter with the unbalancing and balancing circuit.

The input to the operational amplifier 36 is applied to the gate of a junction field effect transistor $Q_{17}$. Since a characteristic of the junction field effect transistor is that the gate to source circuit is practically an open circuit when properly biased, there is practically no transistor $Q_{17}$ gate current. Transistor $Q_{17}$ therefore serves a voltage to current converter which substantially isolates the input from the remainder of the operational amplifier 36.

Transistors $Q_{18}$, $Q_{19}$, $Q_{20}$, $Q_{21}$ and $Q_{22}$ in FIG. 10, form a substantially conventional operational amplifier with the base of transistor $Q_{18}$ connected to the drain of transistor $Q_{17}$. Resistors $R_{21}$ and $R_{22}$, Zener diode $D_9$ and diodes $D_{10}$ and $D_{11}$ are connected to transistors $Q_{18}$–$Q_{22}$ to form the associated biasing and voltage clamping circuitry of the operational amplifier 36.

The collector of a transistor $Q_{23}$ is connected to the drain of transistor $Q_{17}$ and the emitter of transistor $Q_{23}$ is connected through a bias resistor $R_{23}$, and the source to drain circuit of a junction field effect transistor $Q_{24}$, to the emitter of transistor $Q_{20}$. Transistor $Q_{23}$ serves as a controlled constant current generator and transistor $Q_{24}$ serves as a voltage controlled resistor in the emitter circuit of transistor $Q_{23}$. Capacitor $C_7$, resistor $R_{24}$ and diodes $D_{12}$ and $D_{13}$ are connected inn the base circuit of transistor $Q_{23}$ to provide clamped base bias.

Control of the current generated by the current generator, transistor $Q_{23}$, is effected by a capacitor $C_8$ connected between the gate and source terminals of transistor $Q_{24}$. As the gate to source circuit of transistor $Q_{24}$ is practically an open circuit, the voltage across capacitor $C_8$ will substantially not discharge through the gate to source circuit during the measuring cycle of the voltmeter. Therefore, the voltage across capacitor $C_8$ determines the effective resistance of field effect transistor $Q_{24}$. Control of the current source is therefore effected by controlling the voltage across capacitor $C_8$.

Following the measuring cycle as described above, the read in-readout section 26 goes to the "readout" state activating the unbalance-balance section 54 to generate an unbalance amplifier signal. The unbalance amplifier signal is applied through capacitor $C_9$ and diode $D_{14}$ to the junction of capacitor $C_8$ and the gate of transistor $Q_{24}$. The generated pulse momentarily changes the effective resistance of transistor $Q_{24}$, thereby changing the current generated by the constant current generator transistor $Q_{23}$ and unbalancing the amplifier.

After the short time delay $t_d$ described above, the zero signal from the zero-operate section 20 is applied through a resistor $R_{25}$ to the emitter of a current control transistor $Q_{25}$ which has its collector connected to the junction of capacitor $C_8$ and the gate of transistor $Q_{24}$ and its base connected to common point. Since the other side of capacitor $C_8$ is connected to the emitter of transistor $Q_{20}$ which in turn has its collector connected to the common point, a charging path for capacitor $C_8$ is created.

The charge across capacitor $C_8$ continues to build up, modifying the effective resistance of transistor $Q_9$, and the current generated by the current generator transistor $Q_{18}$, until the amplifier is balanced. At that time, the zero-current signal triggers the zero-operate section 20 (FIG. 6) back into the "operate" state. This removes the zero signal from the emitter of transistor $Q_{25}$, effectively open-circuiting its emitter to collector circuit. The charging path for capacitor $C_8$ is then disconnected and the capacitor is essentially connected only between the gate to source circuit of transistor $Q_{24}$.

Capacitor $C_8$ then remains at substantially that particular charge level until the next unbalance signal arrives. Therefore, the current generated by the constant current generator transistor $Q_{23}$, also remains substantially constant.

A parallel combination of a resistor $R_{26}$ and diode $D_{15}$ connected between the common terminal and the junction of diode $D_{14}$ and capacitor $C_9$ serves to furnish a resistive load for the negative unbalance-amplifier signal and also ensures that a positive pulse from the unbalance-balance section 54 does not affect the voltage setting of capacitor $C_8$.

Component values for the operational amplifier illustrated in FIG. 10 are as follows:

| | |
|---|---|
| $Q_{18}$ | MPS 6523 (Motorola) $-V_{CC}$ 40 volts |
| $Q_{19}$ | MPS 6523 (Motorola) $+V_{CC}$ 3.7 volts |
| $Q_{20}$ | 2N4410 (Motorola) |
| $Q_{21}$ | 2N5086 (Motorola) |
| $Q_{22}$ | 2N5086 (Motorola) |
| $Q_{23}$ | MPS 6523 (Motorola) |
| $Q_{24}$ | MPF 151 (Motorola) |
| $Q_{25}$ | 2N5086 (Motorola) |
| $R_{21}$ | 10 Kilohms |
| $R_{22}$ | 10 Kilohms |
| $R_{23}$ | 47 Kilohms |
| $R_{24}$ | 470 Kilohms |
| $R_{25}$ | 270 Kilohms |
| $R_{26}$ | 220 Kilohms |
| $C_7$ | 130 picofarads |
| $C_8$ | 10 microfarads |
| $C_9$ | .01 microfarad |
| $D_9$ | MZ500–10 (Motorola) |
| $D_{11}$ | MZ500–7 (Motorola) |
| $D_{12}$ | IN914 (Texas Instrument) |
| $D_{13}$ | IN914 (Texas Instrument) |
| $D_{14}$ | IN914 (Texas Instrument) |
| $D_{15}$ | IN914 (Texas Instrument) |
| $D_{16}$ | IN459 (Texas Instrument) |

It will be apparent from the foregoing that, while particular forms of the invention have been illustrated and described, various modifications may be made without departing from the spirit and scope of the invention.

I claim:

1. In an analog-to-digital converter of the dual slope integrating type wherein an unknown input voltage is integrated for a predetermined first integration period to charge an integrating capacitor in a charge mode and then a reference voltage is integrated for a second integration period to discharge said integrating capacitor in a discharge mode until a zero-voltage level across said integrating capacitor is reached, with the second integration period being proportional to the unknown input voltage, the combination of:

electrical integrating means including an integrating capacitor and a high gain amplifier;

full wave bridge circuit means for connecting said integrating capacitor in a full wave bridge circuit during said charge mode to charge said capacitor in one direction and for connecting said capacitor for discharging in the opposite direction during said discharge mode;

balancing means for balancing said amplifier;

cycle control means for sequentially connecting said integrating means in a measuring cycle and a balancing cycle, said balancing means being connected to said amplifier during said balancing cycle to set a balance condition for said amplifier defined as a substantially zero output level for a zero input signal to said amplifier, said balancing means further setting zero-voltage and zero-current initial conditions for said integrating capacitor prior to connecting said integrating means in said measuring cycle.

2. An analog to digital converter for producing a digital indication of the numeric value of an unknown input voltage comprising:

an integrator including an operational amplifier and an integrating capacitor in a feedback network for said amplifier, the voltage across said integrating capacitor being initially set at a zero-voltage level;

a source of reference voltage;

a source of clock pulses;

counter means for counting said clock pulses, said counter means being initially set to a zero count;

charge-discharge control means for connecting said integrating capacitor in charge and discharge modes, said feedback network having full wave bridge circuit means for connecting said integrating capacitor in a full wave bridge circuit during said charge mode to charge said integrating capacitor in one direction and connecting said integrating capacitor for discharging in the opposite direction during said discharge mode, said charge-discharge control means connecting the unknown input voltage to said integrator during said charge mode to charge said integrating capacitor while simultaneously feeding clock pulses to said counter means until the count in said counter means is numerically equal to the numerical value of said reference voltage, said charge-discharge control means thereafter resetting said counter means to said zero count and connecting said source of reference voltage to said integrator during said discharge mode to discharge said capacitor while simultaneously feeding clock pulses to said counter means until said zero-voltage level across said capacitor is reached.

3. In an analog to digital converter of the dual-slope integrating type wherein an unknown input voltage is integrated by an integrator in a charge mode for a predetermined time period to charge an integrating capacitor and then a reference voltage is integrated by the integrator in a discharge mode to discharge the integrating capacitor until a zero-voltage level across the integrating capacitor is reached, with the second integration period being proportional to the unknown input voltage, the combination of:

a source of high frequency clock pulses;

division means connected to said source of high frequency clock pulses, the output of said division means providing a source of low frequency clock pulses;

counter means;

over-range sensing means connected to said counter means to develop an over-range signal when the count in said counter is equal to or above a predetermined over-range count;

under-range sensing means connected to said counter means for developing an under-range signal when the count in said counter means is equal to or below a predetermined under-range count;

range control means for selectively feeding said high and low frequency clock pulses to said counter means during said charge and discharge periods with a high range being defined as feeding high frequency clock pulses to said counter during said charge mode and feeding low frequency clock pulses to said counter during said discharge mode, a mid-range being defined as feeding low frequency clock pulses to a counter during both said charge and discharge modes and a low range being defined as feeding low frequency clock pulses to said counter during said charge mode and feeding high frequency clock pulses to said counter during said discharge mode; and range changing means connected to said over and under-range sensing means and said range control means to automatically change the range when an under or over-range signal is developed.

4. The combination defined in claim 3 wherein said division means includes a divide-by-10 counter means.

5. A range control apparatus for providing high, mid and low voltage ranges for an analog to digital converter of the dual slope integrating type wherein an unknown input voltage is integrated during a first integration period while clock pulses are fed to a counter means until a predetermined count is reached and then the counter is reset and a reference voltage is integrated during a second integration period to discharge the integrating capacitor while clock pulses are again fed to the counter means until a zero-voltage level across the integrating capacitor is reached with the count in the counter when the zero-voltage level is reached being proportional to the unknown input voltage, said range control apparatus comprising:

a source of high frequency clock pulses;

a source of low frequency clock pulses;

range control means connected to said counter means and said sources of high and low frequency clock pulses for selectively feeding high frequency clock pulses to the counter means during the first integration period and feeding low frequency clock pulses to the counter during the second integration period, for the high range, feeding low frequency clock pulses to the counter means during both the first and second integration periods for the mid range and feeding low frequency clock pulses to the counter means during the first integration period and feeding high frequency clock pulses to the counter means during the second integration period for the low range.

6. The range control apparatus of claim 5 including:

under-range sensing means connected to the counter means for developing an under-range signal when the count in the counter means is equal to or below a predetermined under-range count;

over-range sensing means connected to the counter means for developing an over-range signal when the count in the counter means is equal to or above a predetermined over-range count; and range changing means connected to said over and under-range sensing means and said range control means to automatically change the range of the analog to digital converter when an under or over-range signal is produced.

7. An analog to digital converter for producing a digital indication of the numeric value of an unknown input voltage comprising:

an operational amplifier;

a feedback network for said amplifier including an integrating capacitor;

balancing means for balancing said operational amplifier;

cycle control means for sequentially connecting said operational amplifier and said integrating capacitor in a measuring cycle and a balancing cycle, said measuring cycle defining charge and discharge modes for said integrating capacitor, said balancing means balancing said operational amplifier during said balancing cycle so that the voltage across, and the current through, said integrating capacitor are set to zero-voltage and zero-current levels during said balancing cycle;

a source of reference voltage;

a source of high frequency clock pulses;

a source of low frequency clock pulses;

counter means for counting said high and low frequency clock pulses;

full wave bridge circuit means connected to said feedback network for connecting said integrating capacitor in a full wave bridge circuit during said charge mode to charge said capacitor in one direction and for connecting said capacitor to discharge in the opposite direction during said discharge mode;

count sensing means for sensing a predetermined count in said counter means;

means for resetting said counter means to a zero count in response to said count sensing means sensing said predetermined count;

charge-discharge control means for connecting said operational amplifier and said integrating capacitor in said charge and discharge modes, said charge-discharge control means connecting said unknown input voltage to said operational amplifier during said charge mode to charge said integrating capacitor while simultaneously feeding clock pulses to said counter means until the count in said counter means reaches said predetermined count and said charge-discharge control means thereafter connecting said source of reference voltage to said operational amplifier during said discharge mode to discharge said capacitor while simultaneously feeding clock pulses to said counter means until said zero-voltage level across said integrating capacitor is reached;

under-range sensing means connected to said counter means for developing an under-range signal when the count in said counter means is equal to or below a predetermined under-range count;

over-range sensing means connected to said counter means to develop an over-range signal when the count in said counter means is equal to or above a predetermined over-range count;

range control means connected to said counter means and said sources of high and low frequency clock pulses for selectively feeding said high frequency clock pulses to said counter means during said charge period and feeding said low frequency clock pulses to said counter means during said discharge period to define a high range for said converter, feeding said low frequency clock pulses to said counter means during both said charge and discharge periods to define a mid-range for said converter and feeding said low frequency clock pulses to said counter means during said charge period and feeding said high frequency clock pulses to said counter means during said discharge period to define a low range for said converter; and range changing means connected to said under and over-range sensing means and said range control means to change the range when an under or over-range signal is developed.

8. The analog to digital converter of claim 7 including display means for indicating the numeric count in said counter means when said zero-voltage level across said integrating capacitor is reached.

9. The analog to digital converter of claim 7 wherein said balancing means includes:

controlled constant current generating means connected to said operational amplifier, the current generated by said controlled current generating means being substantially constant during said measuring cycle;

unbalancing means for changing the current level generated by said current generating means during said balancing cycle; and rebalancing means for varying the current generated by said current generating means until said operational amplifier is balanced.

10. An electrical system comprising:

electrical integrating means for performing recurrent integrations, each of said integrations having a measuring cycle for measuring an unknown electrical parameter and each measuring cycle has a first and second time period, said integrating means having a high gain amplifier and an integrating capacitor connected between an input and an output of said amplifier;

balancing means connected to said amplifier for automatically balancing said amplifier prior to each of said integrations, the balance condition of said amplifier being defined as a substantially zero output level for a zero input signal to said amplifier;

counter means;

a plurality of sources of clock pulses, each of said sources providing a different frequency of clock pulse;

range control means connected to said counter means and said sources of clock pulses for automatically selectively connecting different ones of said sources of clock pulses to said counter means during said first and second time periods, respectively, with said counter means being set to an initial count prior to each time period and the relative frequencies of the clock pulses fed to said counter means during said first and second time periods determining different ranges for said electrical system.

11. The electrical system of claim 24, wherein:

said electrical integrating means includes an integrating capacitor; and including full wave bridge means connected to said integrating means for connecting said integrating capacitor in a full wave bridge circuit to charge said capacitor in one direction, whereby an input signal may be applied directly to an input to said integrating means regardless of the polarity of that input signal.

* * * * *

PO-1050
(5/69)

UNITED STATES PATENT OFFICE
CERTIFICATE OF CORRECTION

Patent No. 3,703,001 Dated November 14, 1972

Inventor(s) HIBBS, JR.

It is certified that error appears in the above-identified patent and that said Letters Patent are hereby corrected as shown below:

Column 26, line 29, delete "24" and insert therefor --10--.

Signed and sealed this 29th day of May 1973.

(SEAL)
Attest:

EDWARD M. FLETCHER, JR.
Attesting Officer

ROBERT GOTTSCHALK
Commissioner of Patents